(12) United States Patent
Pai et al.

(10) Patent No.: US 6,503,776 B2
(45) Date of Patent: Jan. 7, 2003

(54) METHOD FOR FABRICATING STACKED CHIP PACKAGE

(75) Inventors: Tsung-Ming Pai, Tainan Hsien (TW); Chih Min Pao, Kaohsiung (TW); Kuang-Hui Chen, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 8 days.

(21) Appl. No.: 09/754,293

(22) Filed: Jan. 5, 2001

(65) Prior Publication Data

US 2002/0090753 A1 Jul. 11, 2002

(51) Int. Cl.⁷ .................. H01L 21/44; H01L 21/48; H01L 21/50
(52) U.S. Cl. .................. 438/106; 438/107; 438/108; 438/112; 438/118
(58) Field of Search .................. 438/106, 107, 438/108, 112, 118

(56) References Cited

U.S. PATENT DOCUMENTS

| | | | | |
|---|---|---|---|---|
| 5,140,404 A | * | 8/1992 | Fogal et al. | 437/206 |
| 5,177,032 A | * | 1/1993 | Fogal et al. | 437/220 |
| 5,323,060 A | | 6/1994 | Fogal et al. | |
| 5,729,050 A | * | 3/1998 | Kim | 257/667 |
| 5,804,004 A | * | 9/1998 | Tuckerman et al. | 156/60 |
| 5,874,781 A | * | 2/1999 | Fogal et al. | 257/777 |
| 5,886,412 A | * | 3/1999 | Fogal et al. | 257/777 |
| 5,952,725 A | * | 9/1999 | Ball | 257/777 |
| 5,963,794 A | * | 10/1999 | Fogal et al. | 438/108 |
| 6,005,778 A | * | 12/1999 | Spielberger et al. | 361/770 |
| 6,014,586 A | * | 1/2000 | Weinberg et al. | 607/36 |
| 6,051,886 A | * | 4/2000 | Fogal et al. | 257/777 |
| 6,087,722 A | * | 7/2000 | Lee et al. | 257/723 |
| 6,181,002 B1 | * | 1/2001 | Juso et al. | 257/686 |
| 6,333,562 B1 | * | 2/2001 | Lin | 257/777 |
| 6,208,018 B1 | * | 3/2001 | Ma et al. | 257/669 |
| 6,211,564 B1 | * | 4/2001 | Hatano | 257/686 |
| 6,215,182 B1 | * | 4/2001 | Ozawa et al. | 57/723 |
| 6,215,193 B1 | * | 4/2001 | Tao et al. | 257/777 |
| 6,239,496 B1 | * | 5/2001 | Asada | 257/777 |
| 6,252,305 B1 | * | 6/2001 | Lin et al. | 257/777 |
| 6,351,028 B1 | * | 2/2002 | Akram | 257/686 |

* cited by examiner

Primary Examiner—Jerome Jackson
Assistant Examiner—Shrinivas H. Rao

(57) ABSTRACT

A method for fabricating a stacked chip package comprises the steps of: (a) attaching a lower chip to a substrate or a lead frame; (b) electrically coupling the lower chip to the substrate or the lead frame; (c) providing a dummy chip with a film adhesive on a upper surface thereof; (d) attaching the dummy chip to the lower chip through an adhesive layer wherein a lower surface of the dummy chip is in contact with the adhesive layer; (e) attaching an upper chip to the dummy chip through the film adhesive; (f) electrically coupling the upper chip to the substrate or the lead frame; and (g) encapsulating the lower chip and the upper chip against a portion of the substrate or the lead frame with a molding compound. Since the dummy chip is bonded to the upper chip via a film adhesive, it is not necessary to monitor the thickness of the film adhesive after the upper chip is bonded to the dummy chip.

18 Claims, 4 Drawing Sheets

METHOD FOR FABRICATING STACKED CHIP PACKAGE

BACKGROUND OF THE INVENTION

1. Field of the Invention

This invention relates to a method for fabricating a stacked chip package, and more specifically to packaging semiconductor chips on a substrate in a stacking arrangement.

2. Description of the Related Art

With ever increasing demands for miniaturization and higher operating speeds, multi-chip modules (MCMs) are increasingly attractive in a variety of electronics. MCMs which contain more than one chip can help minimize the system operational speed restrictions imposed by long printed circuit board connection traces by combining, for example, the processor, memory, and associated logic into a single package. In addition, MCMs decrease the interconnection length between IC chips thereby reducing signal delays and access times.

The most common MCM is the "side-by-side" MCM. In this version two or more IC chips are mounted next to each other (or side by side each other) on the principal mounting surface of a common substrate. Interconnections among the chips and conductive traces on the substrate are commonly made via wire bonding. The side-by-side MCM, however, suffers from a disadvantage that the package efficiency is very low since the area of the common substrate increases with an increase in the number of semiconductor chips mounted thereon.

Therefore, U.S. Pat. No. 5,323,060 teaches a multichip stacked device (see FIG. 1) comprising a first semiconductor chip 110 attached to a substrate 120 and a second semiconductor chip 130 stacked atop the first semiconductor chip 110. The chips 110, 120 are respectively wire bonded to the substrate 120. U.S. Pat. No. 5,323,060 is characterized by using an adhesive layer 140 between the two chips to provide clearance between the chips for the loops of the bonding wires 150. The adhesive layer has a thickness greater than the loop height defined by the distance between the active surface of the chip 110 and the vertexes of the outwardly projecting loops of the bonding wires 150 so as to prevent the bonding wires 150 from contacting the chip 130. The normal loop height is generally about 10 to 15 mils. As thinner packages have been developed, the loop height has been reduced with conventional bonding techniques down to about 6 mils in height by changes in the loop parameters, profile and wire types. However, this loop height is considered to be a minimum obtainable loop height as attempts to go lower have caused wire damage and poor wire pull strengths. Therefore, using this conventional bonding technique, the adhesive layer 140 must have a thickness of at least 8 mils to prevent the bonding wires 150 from contacting the chip 130. Typical materials for the adhesive layer 140 include epoxy and tape. However, it is very difficult to form an epoxy layer with a stable bond line thickness above 3 mils. Further, even using a tape with a thickness of 8 mils, it will increase the cost of the final product, and the reliability of resulted package will suffer from the CTE mismatch between thermoplastic tape and silicon chip.

Therefore, the semiconductor industry develops a stacked chip package 200 (see FIG. 2) characterized by using a dummy chip 160 to provide clearance between the chips for the loop of the underlying bonding wire. The dummy chip 160 is interposed between the chips 110, 130 via two adhesive layers 162, 164. Typically, the adhesive layers 162, 164 are formed from thermosetting epoxy material. Since it is not easy to control the bond line thickness of epoxy adhesive, a vision system is used to monitor the bond line thickness of the adhesive layer 164 after the chip 130 is bonded to the dummy chip 160 thereby assuring the bonding reliability. But currently the vision system is unable to measure the bond line thickness of the adhesive layer 164 since the chip 130 hinders the vision system from measuring. Once the bond line thickness is not under control, it will introduce unsatisfactory coplanarity after mounting the chip 130.

SUMMARY OF THE INVENTION

It is a primary object of the present invention to provide a method for fabricating a stacked chip package which overcomes, or at least reduces the above-mentioned problems of the prior arts.

The method for fabricating a stacked chip package in accordance with the present invention comprises the steps of: (a) attaching a lower chip to means for supporting chips, the supporting means being provided with a structure for making external electrical connection; (b) electrically coupling the lower chip to the structure for making external electrical connection; (c) providing a dummy chip with a film adhesive on a upper surface thereof; (d) attaching the dummy chip to the lower chip through an adhesive layer wherein a lower surface of the dummy chip is in contact with the adhesive layer; (e) attaching an upper chip to the dummy chip through the film adhesive; (f) electrically coupling the upper chip to the structure for making external electrical connection; and (g) encapsulating the lower chip and the upper chip against a portion of the supporting means with a molding compound.

It is far easier to control the thickness of the film adhesive layer than the bond line thickness of the epoxy adhesive. Since the dummy chip is bonded to the upper chip via a film adhesive, it is not necessary to monitor the thickness of the film adhesive after the upper chip is bonded to the dummy chip.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

FIGS. 3–8 illustrates a method for fabricating a stacked chip package according to a first preferred embodiment of the present invention.

Figure 1:
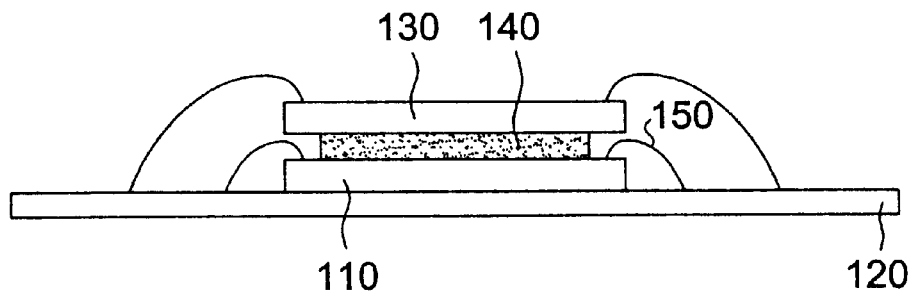
FIG. 1 is a cross-sectional view of a conventional multi-chip stacked device.
Figure 2:
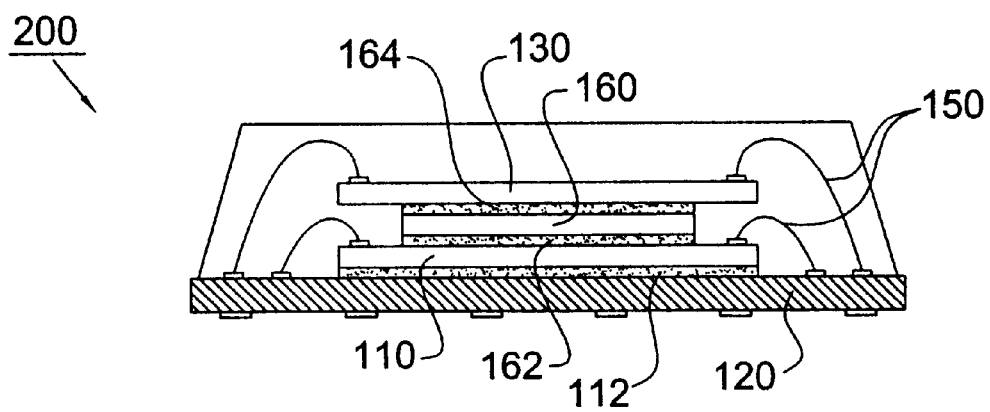
FIG. 2 is a cross-sectional view of another conventional stacked chip package.
Figure 3:
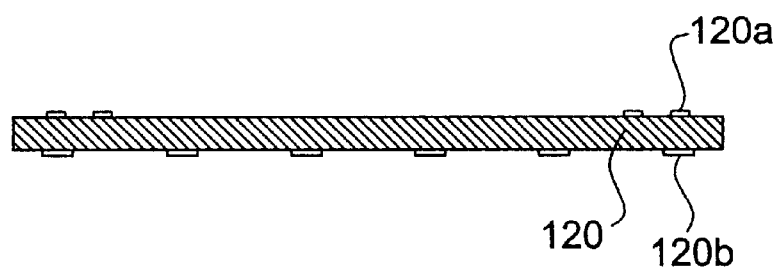
FIGS. 3–8 illustrates a method for fabricating a stacked chip package according to a first preferred embodiment of the present invention.

FIG. 3 shows a substrate 120. Preferably, the substrate 120 is made of fiberglass reinforced BT (bismaleimidetriazine) resin or FR-4 fiberglass reinforced epoxy resin. The substrate 120 is provided with a structure for making external electrical connection comprising a plurality of conductive leads 120a. The leads 120a on the upper surface of the substrate 120 are electrically connected to the solder pads 120b on the lower surface of the substrate 120 through vias (not shown). It should be understood that the substrate may be replaced with a ceramic substrate or a lead frame.

Figure 4:
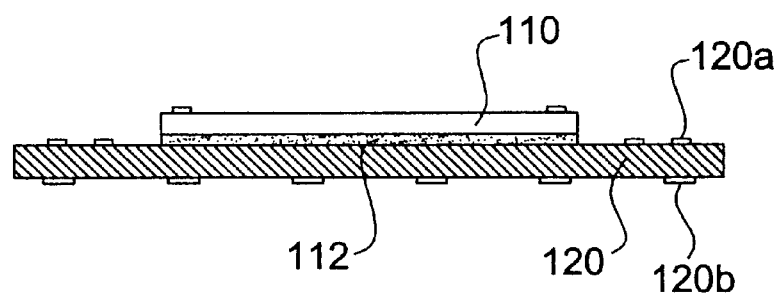
Figure 5:
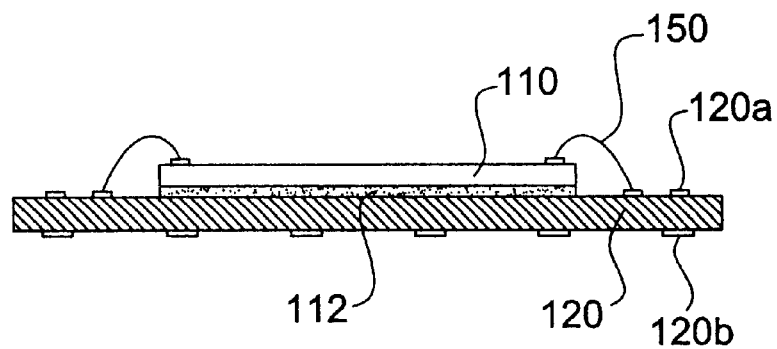

Referring to FIG. 4, a semiconductor chip 110 is attached onto the upper surface of the substrate 120 through an adhesive layer 112. Referring to FIG. 5, bonding wires 150 are connected to the bonding pads 110a on the chip 110 and the conductive leads 120a on the upper surface of the substrate 120 using known wire bonding techniques.

Figure 6:
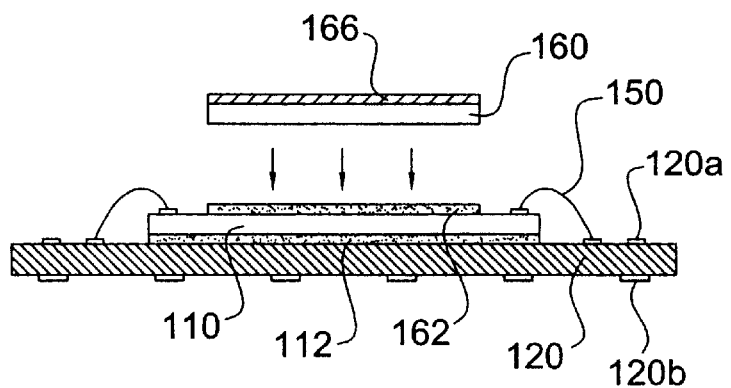

Referring to FIG. 6, an adhesive layer 162 is applied onto the chip 110 by dispensing, and then a dummy chip 160 with a film adhesive 166 on the upper surface thereof is attached by conventional automatic chip-attach operation. It is noted that the dummy chip 160 has the same material as the semiconductor chip mounted on the substrate. Wiring is not required for the dummy chip because it is not employed in the device operation.

Thereafter, the adhesive layer 162 is cured. The curing process can be performed in an oven or by blowing hot air to the adhesive layer 162. The curing time and temperature is determined by the amount of time required so that the adhesive layer 162 is cured but physical and chemical properties of the film adhesive 166 remains unaffected. Curing temperature depends on materials used in adhesive layer; typically, it is higher than the maximum exothermic temperature of the adhesive layer. Typically, the maximum exothermic temperature can be calculated from the heat of cure curve for the adhesive layer detected by Differenfial Scanning Calorimeter (DSC). Therefore, the maximum exothermic temperature of the adhesive layer 162 should be lower than that of the film adhesive 166. Preferably, the adhesive layer 162 is chosen to become cured in 30 seconds at 120° C. A suitable adhesive is QMI536 commercially available from QUANTUM MATERIALS, INC. The film adhesive of the present invention is preferably made of an adhesive polyimide or epoxy composition. Preferably, the film adhesive begins to show adhering property at a heating temperature of more than 150° C. Furthermore, the film adhesive shows substantially no adhesion strength under room temperature so as to prevent impurities from adhering thereon thereby assuring the reliability of the finished package. A suitable film adhesive is DF440 commercially available from HITACHI.

Figure 7:
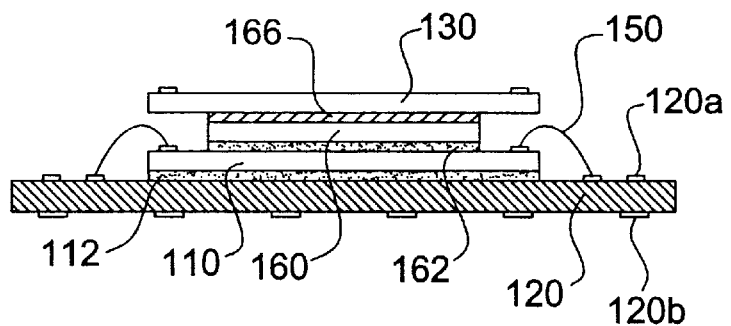

Referring to FIG. 7, a semiconductor chip 130 is attached onto the dummy chip 160 through the film adhesive layer 166.

Figure 8:
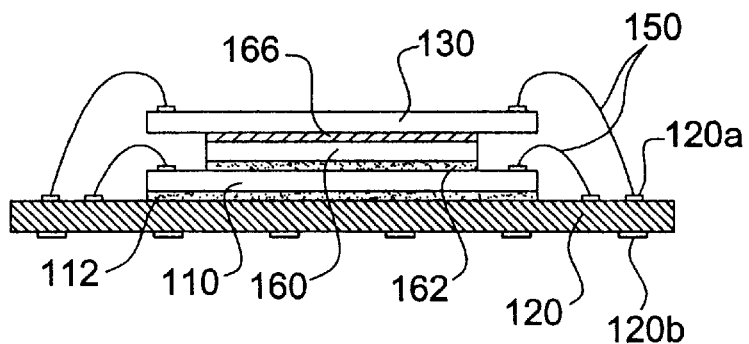

Referring to FIG. 8, bonding wires 150 are connected to the bonding pads of the chip 130 and the conductive leads 120a on the upper surface of the substrate 120 using known wire bonding techniques.

Finally, it is preferable to encapsulate the assembly shown in FIG. 8 with a molding compound wherein the molding compound is formed over the semiconductor chips 110, 130 and a portion of the upper surface of the substrate 120 using known plastic molding methods such as transfer molding.

Figure 9:
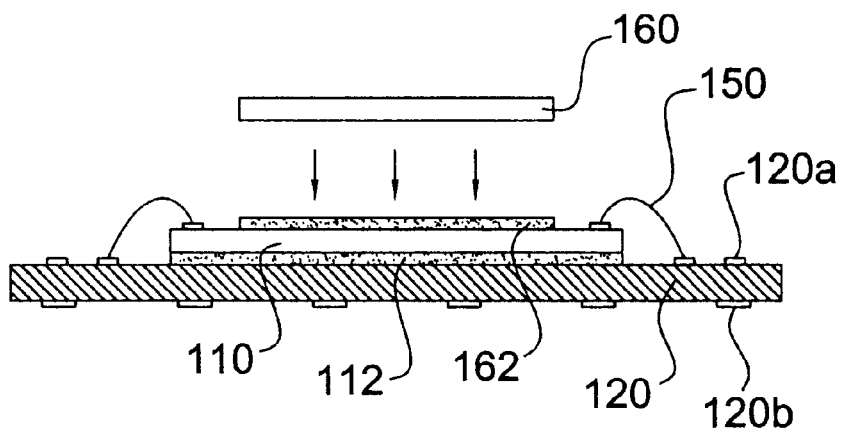
FIGS. 9–10 illustrates a method for fabricating a stacked chip package according to a second preferred embodiment of the present invention.
Figure 10:
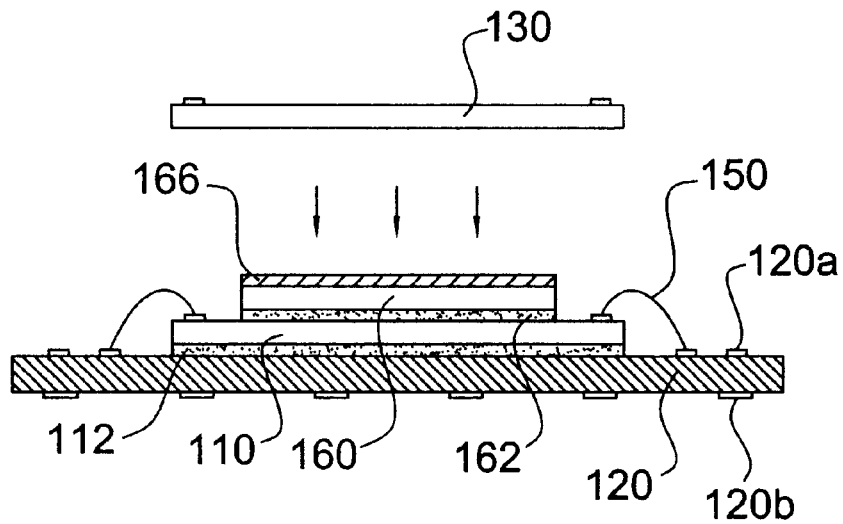

FIGS. 9–10 illustrates a method for fabricating a stacked chip package according to a second preferred embodiment of the present invention. As shown in FIG. 9, in the this embodiment, the method is characterized in that the dummy chip 160 is attached onto the chip 110 by conventional automatic chip-attach operation wherein the lower surface of the dummy chip is in contact with the adhesive layer 162. After the adhesive layer 162 is cured, a film adhesive 166 is attached onto the upper surface of the dummy chip 160 (see FIG. 10). Thereafter, the chip 130 is attached to the dummy chip 160 using the film adhesive 166. Other process steps are substantially the same as those described above in connection with the first embodiment.

According to the method for fabricating a stacked chip package of the present invention, since the dummy chip 160 is bonded to the upper chip 130 via a film adhesive 166, it is not necessary to monitor the thickness of the film adhesive after the upper chip is bonded to the dummy chip. Furthermore, the thickness of the film adhesive 166 may be adjusted by the requirements of customers without sacrificing the reliability, because it is far easier to control the thickness of the film adhesive layer than the bond line thickness of the epoxy adhesive.

Although the invention has been explained in relation to its preferred embodiment, it is to be understood that many other possible modifications and variations can be made without departing from the spirit and scope of the invention as hereinafter claimed.

What is claimed is:

1. A method of fabricating a stacked chip package, comprising the steps of: attaching a first chip means for supporting chips, the supporting means being provided with a structure for making external electrical connection;

electrically coupling the first chip to the structure for making external electrical connection;

providing a dummy chip with a film adhesive on an upper surface thereof;

attaching the dummy chip to the first chip through an adhesive layer wherein a lower surface of the dummy chip is in contact with the adhesive layer;

attaching a second chip to the dummy chip through the film adhesive, wherein the second chip is substantially larger in size than the dummy chip; electrically coupling the second chip to the structure for making external electrical connection; and encapsulating the first chip and the second chip against a portion of the supporting means with a molding compound; and wherein the maximum exothermic temperature of the adhesive layer is lower than that of the film adhesive.

2. The method as claimed in claim 1, wherein the adhesive layer has a curing temperature of less than 120° C.

3. The method as claimed in claim 2, wherein the film adhesive begins to show adhering property at a heating temperature of more than 150° C.

4. The method as claimed in claim 1, wherein the film adhesive shows substantially no adhesion strength under room temperature.

5. A method of fabricating a stacked chip package, comprising the steps of: attaching a first chip means for supporting chips, the supporting means being provided with a structure for making external electrical connection;

electrically coupling the first chip to the structure for making external electrical connection;

attaching the dummy chip to the first chip through an adhesive layer wherein a lower surface of the dummy chip is in contact with the adhesive layer;

attaching a second chip to the dummy chip through the film adhesive, wherein the second chip is substantially larger in size than the dummy chip; electrically coupling the second chip to the structure for making external electrical connection; and encapsulating the first chip and the second chip against a portion of the supporting means with a molding compound; and wherein the maximum exothermic temperature of the adhesive layer is lower than that of the film adhesive.

6. The method as claimed in claim 5, wherein the film adhesive begins to show adhering property at a heating temperature of more than 150° C.

7. The method as claimed in claim 5, wherein the film adhesive shows substantially no adhesion strength under room temperature.

8. The method of claim 1, wherein the step of attaching the second chip to the dummy chip is performed so that the second chip is positioned with at least two opposite side edges thereof extending outwardly beyond corresponding opposite side edges of the dummy chip.

9. The method of claim 1, wherein the film adhesive has a predetermined thickness.

10. The method of claim 5, wherein the step of attaching the second chip to the dummy chip is performed so that the second chip is positioned with at least two opposite side edges thereof extending outwardly beyond corresponding opposite side edges of the dummy chip.

11. The method of claim 5, wherein the film adhesive has a predetermined thickness.

12. A method of fabricating a stacked chip package, comprising the steps of:

attaching a first chip to a support, the support being provided with a structure for making external electrical connection;

electrically coupling the first chip to the structure for making external electrical connection;

providing a dummy chip;

providing a film adhesive on an upper surface of the dummy chip;

applying an adhesive layer on an upper surface of the first chip;

attaching the dummy chip to the first chip through the applied adhesive layer wherein a lower surface of the dummy chip is in contact with the adhesive layer;

attaching a second chip to the dummy chip through the film adhesive;

electrically coupling the second chip to the structure for making the external electrical connection; and encapsulating the first chip and the second chip against a portion of the supporting means with a molding compound; and wherein the maximum exothermic temperature of the adhesive layer is lower than that of the film adhesive.

13. The method of claim 12, wherein a maximum exothermic temperature of the adhesive layer is lower than that of the film adhesive.

14. The method of claim 13, wherein the step of attaching the second chip to the dummy chip is performed so that the second chip is positioned with at least two opposite side edges thereof extending outwardly beyond corresponding opposite side edges of the dummy chip.

15. The method of claim 13, wherein the film adhesive has a predetermined thickness.

16. The method of claim 13, wherein the step of attaching the dummy chip to the first chip comprises curing the adhesive layer after the film adhesive has been provided on the dummy chip and the dummy chip has been placed with the lower surface thereof in contact with the adhesive layer on the first chip; and a curing temperature of the adhesive layer is lower than a temperature at which the film adhesive begins to show adhering properties.

17. The method of claim 16, wherein said curing temperature is about 120° C. and said temperature is about 150° C.

18. The method of claim 12, wherein the step of attaching the dummy chip to the first chip comprises curing the adhesive layer after the dummy chip has been placed with the lower surface thereof in contact with the adhesive layer on the first chip; and the step of providing the film adhesive on the upper surface of the dummy chip is performed after the adhesive layer has been cured.

* * * * *